United States Patent [19]
Lucas et al.

[11] 3,967,203
[45] June 29, 1976

[54] SIGNAL SEEKING RECEIVER STOPPING CIRCUIT

[75] Inventors: Larry D. Lucas; Burtron D. Schertz; Lester Wilkinson, all of Kokomo, Ind.

[73] Assignee: General Motors Corporation, Detroit, Mich.

[22] Filed: Mar. 3, 1975

[21] Appl. No.: 554,982

[52] U.S. Cl................................. 325/349; 325/468
[51] Int. Cl.². ........................................... H04B 1/32
[58] Field of Search..... 325/346, 348, 349, 468–471

[56] References Cited
UNITED STATES PATENTS

| | | |
|---|---|---|
| 3,492,584 | 1/1970 | Takahashi............................ 325/471 |
| 3,611,155 | 10/1971 | Mayle................................. 325/471 |
| 3,869,674 | 3/1975 | Borbely................................ 325/346 |

Primary Examiner—George H. Libman
Attorney, Agent, or Firm—Albert F. Duke

[57] ABSTRACT

A circuit for generating a center tuned pulse for stopping the operation of a signal seeking FM receiver includes means for developing a bias current which is added to the output currents of the quadrature detector of the receiver. A stopping pulse is generated whenever the difference between the output currents is less than the bias current and a 10.7 mHz. signal is present in the IF amplifier.

2 Claims, 1 Drawing Figure

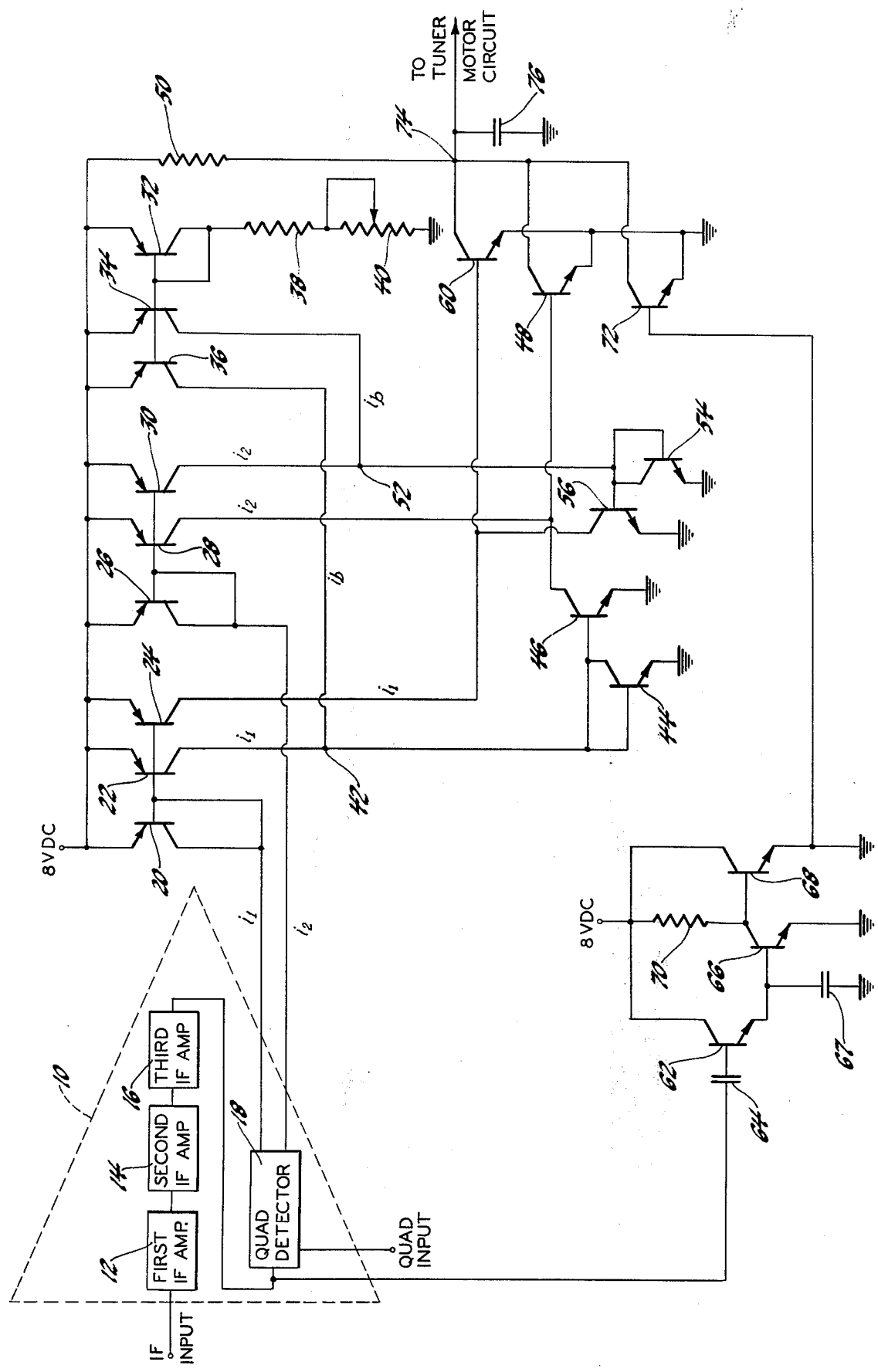

SIGNAL SEEKING RECEIVER STOPPING CIRCUIT

This invention relates to signal seeking radio receivers and more particularly to a control circuit for terminating the signal seeking operation of such a receiver.

In signal seeking type radio receivers a switch is operated to activate apparatus including a drive motor for changing the position of the tuner assembly until a frequency setting is found which corresponds to a station suitable for listening purposes. In FM receivers it is particularly important that the receiver be accurately tuned and this is even more important in automobile receivers because signal strength can change significantly in a few inches of vehicle travel because of multipath reception. When tuning an FM receiver in the presence of a very strong signal, the exact center is difficult to find and if not properly centered, and the automobile moves into a very weak signal level the radio will sound as though it is detuned. This detuning will cause audio distortion, poor ignition noise performance, and in some cases, complete loss of station.

Accordingly, it is an object of the present invention to provide an improved control circuit for automatically terminating the operation of a signal seeking receiver.

It is another object of the present invention to provide a signal seeking stopping circuit which is readily manufacturable as an integrated circuit.

In accordance with the present invention, a circuit is provided which responds to first and second output currents from the quadrature detector of the receiver to control the generation of a pulse for stopping the operation of a signal seeking radio. When the receiver is center tuned the first and second output currents are equal. The circuit supplies a bias current which is added to each of the first and second output currents and whenever the difference between the first and second output currents is less than the bias current the pulse is generated if a 10.7 mHz. signal is present in the IF amplifier. By adding the bias current to the output currents the bandwidth over which a pulse is generated is increased. Since modulation moves the quardature demodulator back and forth from the center tuned point, a filter capacitor is connected across the output of the circuit to prevent the center tuned indicator pulse from being generated at an audio rate.

Other objects and advantages of the present invention will be more apparent from the following detailed description which should be read in conjunction with the single drawing of a detailed schematic representation of the invention.

Referring now to the drawing, a portion of the conventional FM receiver is generally designated 10 and includes first, second and third IF amplifier stages 12, 14 and 16. The output of the third IF amplifier is supplied to a quadrature detector 18. The receiver further includes a tuner which is driven to scan the FM band upon actuation of a switch. The tuner and the tuner control circuit (not shown) are responsive to the pulse generated by the circuit of the present invention for terminating operation of the tuner motor.

The output current $i_1$ of the detector 18 is translated by the diode connected transistor 20 and transistors 22 and 24 so that $i_1$ appears at the collectors of the transistors 22 and 24. Similarly, the diode connected transistor 26 and transistors 28 and 30 translate the current $i_2$ to the collectors of transistors 28 and 30. Diode connected transistor 32 and transistors 34 and 36 develop a bias current $I_b$ at the collectors of transistors 34 and 36. The bias current $I_b$ is established by the resistor 38 and potentiometer 40. The bias current $I_b$ is summed with the output current $i_1$ at a junction 42 and supplied to the base of diode connected transistor 44 and transistor 46. The transistors 44 and 46 have the same emitter area and have their bases at the same potential so the same current flows in transistor 44 and in transistor 46. The collectors of transistors 28 and 46 are connected to the base of transistor 48 which has its emitter grounded and its collector connected to the 8 volt supply through a resistor 50. Similarly, the current $i_2$ and $I_b$ is summed at a junction 52 and supplied to the bases of diode connected transistor 54 and transistor 56. The collectors of transistors 24 and 56 are connected with the base of transistor 60.

The output of the third IF amplifier stage 16 is coupled to the base of transistor 62 through a coupling capacitor 64. The emitter of transistor 62 is connected to the base of transistor 66 and through a capacitor 67 to ground. The collector of transistor 66 is connected with the base of transistor 68 and through a resistor 70 to the 8 volt supply. The emitter of transistor 68 is connected with the base of a transistor 72. The emitters of transistors 48, 60 and 72 are grounded while their collectors are connected with a junction 74. A filter capacitor 76 is connected with the junction 74 and ground.

During the scanning operation of the signal seeking receiver, the quadrature detector currents $i_1$ and $i_2$ will be equal when the receiver is center tuned. Accordingly, the transistor 46 tries to conduct more current than the transistor 28 supplies. This causes the transistor 46 to saturate and to ground the base of the transistor 48. Similarly, transistor 56 tries to conduct more current than the transistor 24 supplies which causes the transistor 56 to saturate and ground the base of transistor 60. If a 10.7 mHz. signal is present in the third IF amplifier 16, transistors 62 and 66 conduct and transistor 68 is driven to cut-off which grounds the base of transistor 72. With transistors 48, 60 and 72 nonconductive, the resistor 50 pulls the collectors of transistors 48, 60 and 72 to the supply voltage causing a positive output pulse of approximately 8 volts amplitude to be generated. Since modulation moves the detector 18 back and forth from the center tuned point, the output of the junction 74 is filtered by the capacitor 76 to prevent the pulses from being generated at an audio rate. The transistor 72 inhibits the generation of a center tuned pulse unless a 10.7 mHz. signal is present in the third IF amplifier 16, otherwise, off-station noise would balance the currents $i_1$ and $i_2$ and cause a false center tuned indicator pulse to be generated. If the receiver is detuned slightly, the currents $i_1$ and $i_2$ are unequal. When the difference in these currents exceeds the magnitude of the current $I_b$ either transistor 46 or 56 (depending upon the direction of inequality in the currents $i_1$ and $i_2$) switches from the saturated to the cut-off state. This causes either transistor 48 or 60 to conduct and ground the junction 74. The potentiometer 40 adjusts the frequency band around the center tuned point over which a center tuned indicator pulse is desired. Adjustments made with the potentiometer 40 are symmetric with respect to the center tuned point.

Having thus described our invention, what we claim is:

1. In an FM receiver having IF amplifier means, and quadrature detector means responsive to the output of said IF amplifier and which produce first and second output currents which are equal when said receiver is center tuned, the improvement comprising means for generating a bias current, means responsive to said first and second output currents and to said bias current for generating an output voltage when the difference between said first and second output currents is less than said bias current, and means responsive to the output of said IF amplifier for inhibiting the generation of said output voltage unless a 10.7 mHz. signal is present in said IF amplifier and capacitance means adapted to be charged from said output voltage.

2. In an FM receiver having IF amplifier means, and quadrature detector means responsive to the output of said IF amplifier and which produces first and second output currents which are equal when said receiver is center tuned, the improvement comprising means for generating a bias current, means for summing said bias current and said first output current to produce a third current, means for summing said bias current and said second output current for producing a fourth current, means responsive to said second output current exceeding said third current or said first output current exceeding said fourth current for generating an output voltage, means responsive to the output of said IF amplifier for inhibiting the generation of said output voltage unless a 10.7 mHz. signal is present in said IF amplifier, and capacitance means adapted to be charged from said output voltage.

* * * * *